United States Patent
Murakami et al.

(10) Patent No.: US 8,121,254 B2
(45) Date of Patent: Feb. 21, 2012

(54) OPTICAL ELEMENT, EXPOSURE APPARATUS USING THIS, AND DEVICE MANUFACTURING METHOD

(75) Inventors: Katsuhiko Murakami, Sagamihara (JP); Takaharu Komiya, Sagamihara (JP)

(73) Assignee: Nikon Corporation, Tokyo (JP)

( * ) Notice: Subject to any disclaimer, the term of this patent is extended or adjusted under 35 U.S.C. 154(b) by 168 days.

(21) Appl. No.: 12/509,292

(22) Filed: Jul. 24, 2009

(65) Prior Publication Data

US 2010/0190113 A1 Jul. 29, 2010

Related U.S. Application Data

(63) Continuation of application No. PCT/JP2008/051119, filed on Jan. 25, 2008.

(30) Foreign Application Priority Data

Jan. 25, 2007 (JP) ................ P2007-014920

(51) Int. Cl.
*G21K 1/06* (2006.01)
*G21K 5/00* (2006.01)
(52) U.S. Cl. .......................... 378/84; 378/34
(58) Field of Classification Search ............ 378/34, 378/43, 82, 84, 85, 70, 145; 430/322; 355/67
See application file for complete search history.

(56) References Cited

U.S. PATENT DOCUMENTS

| | | | | |
|---|---|---|---|---|
| 5,945,204 A | * | 8/1999 | Kumagai et al. | 428/212 |
| 5,958,605 A | | 9/1999 | Montcalm et al. | |
| 6,833,223 B2 | * | 12/2004 | Shiraishi | 430/5 |
| 7,172,788 B2 | | 2/2007 | Yakshin et al. | |
| 7,286,637 B2 | * | 10/2007 | Imai et al. | 378/84 |
| 7,382,527 B2 | * | 6/2008 | Kandaka et al. | 359/359 |
| 7,474,733 B1 | * | 1/2009 | Yamamoto | 378/84 |
| 2006/0245057 A1 | | 11/2006 | Van Herpen et al. | |

FOREIGN PATENT DOCUMENTS

| | | |
|---|---|---|
| EP | 1 367 605 A1 | 5/2002 |
| EP | 1 717 609 | 11/2006 |
| JP | 2001-523007 | 11/2001 |
| JP | 2003-14893 | 1/2003 |
| JP | 2005-505930 | 2/2005 |
| JP | 2006-170916 | 6/2006 |
| JP | 2006-173446 | 6/2006 |
| JP | 2006-310793 | 11/2006 |
| WO | WO 99/24851 | 5/1999 |
| WO | WO 03/032329 A1 | 4/2003 |

OTHER PUBLICATIONS

International Search Report from PCT/JP2008/051119 dated Feb. 13, 2008.
Written Opinion of the International Searching Authority from PCT/JP2008/051119 dated Feb. 26, 2008.

* cited by examiner

*Primary Examiner* — Irakli Kiknadze
(74) *Attorney, Agent, or Firm* — Klarquist Sparkman, LLP

(57) ABSTRACT

On a multilayer film mirror, a protective layer is formed having a varied composition in the depth direction. The protective layer includes an interface side layer formed on a thin film layer, i.e., the outermost layer of a multilayer film, a surface side layer provided on the interface side layer as the outermost surface of an optical element, and an intermediate layer. The interface side layer has properties such as providing relative absorption of non-exposure light from a light source. The surface side layer suppresses oxidation of the surface of the multilayer film.

15 Claims, 5 Drawing Sheets

OPTICAL ELEMENT, EXPOSURE APPARATUS USING THIS, AND DEVICE MANUFACTURING METHOD

CROSS-REFERENCE TO RELATED APPLICATION

This is a Continuation Application of International Application No. PCT/JP2008/051119, filed Jan. 25, 2008, which claims priority to Japanese Patent Application No. 2007-014920, filed Jan. 25, 2007. The contents of the aforementioned applications are incorporated herein by reference.

BACKGROUND

1. Field of the Invention

The present invention relates to an optical element used for extreme ultraviolet radiation, an exposure apparatus using this, and a device manufacturing method.

2. Description of Related Art

In conjunction with the miniaturization of semiconductor integrated circuits in recent years, exposure technology has been developed which, instead of conventional ultraviolet radiation, uses extreme ultraviolet radiation composed of wavelengths (11-14 nm) that are shorter than this conventional radiation in order to enhance optical system resolution that is attained according to the diffraction limits of light. By this means, it is anticipated that exposure light with a pattern size of approximately 5-70 nm will be feasible, and as the refractive index of materials of this region approaches 1, transmission-refractive type optical elements cannot be used as heretofore, and reflective optical elements are used. For reasons also of transmissivity assurance and the like, the mask used in the exposure apparatus is that of an ordinary reflective optical element. In this regard, in order to attain a high reflectance in each optical element, it is common to alternately laminate atop a substrate a material with a high refractive index and a material with a low refractive index in the employed wavelength region (see, e.g., Japanese Unexamined Patent Application, First Publication No. 2003-14893).

SUMMARY

In the case where oxygen, moisture or the like remains inside the aforementioned type of exposure apparatus, an oxidation reaction is produced when the surface of the optical element is irradiated with extreme ultraviolet radiation. Due to this, the problem arises that reaction properties of the optical element are degraded, and that life is shortened.

Moreover, the light source that is employed by the exposure apparatus not only emits the extreme ultraviolet radiation required for exposure, but also non-exposure light that is unnecessary for exposure. When non-exposure light is included in the source light, it engenders the problems of: (1) degradation of imaging properties of the projection optical system; (2) reduction in resolution of the pattern; and (3) generation of distortions in the alignment accuracy of the sensitive substrate.

A purpose of some aspects of the present invention is to offer an optical element which improves optical properties by incorporating the two qualities of oxidation resistance and absorptivity of non-exposure light in a balanced manner.

Other purposes are to offer an exposure apparatus which incorporates the aforementioned type of optical element as a projection optical system or the like that uses extreme ultraviolet radiation and to offer a device manufacturing method.

An aspect of the present invention provides an optical element including: (a) a substrate used for support; (b) a multilayer film which is supported on the substrate, and which reflects exposure light containing at least one of ultraviolet radiation and soft X-radiation from source light in a prescribed wavelength region; and (c) a protective layer which is provided on the multilayer film, which prevents oxidation of the pertinent multilayer film, and which has an absorption index relative to non-exposure light (other than exposure light) that is larger than the absorption index relative to exposure light.

In the aforementioned optical element, with respect to, for example, the protective layer, a single layer may be given the two properties of oxidation resistance and absorptivity of non-exposure light by, for example, changing composition in the depthwise direction. Consequently, it is possible to inhibit oxidation of the optical element, and prevent reduction in the reflectance of the optical element by, for example, the oxidation-resistant portion of a protective layer that is endowed with oxidation resistance. In addition, it is possible to relatively absorb non-exposure light compared to exposure light, and reduce the non-exposure light that is projected onto a sensitive substrate such as a wafer by, for example, the non-exposure-light-absorptive portion of a protective layer that is endowed with the capability of absorbing non-exposure light.

Another aspect of the present invention provides an optical element including: (a) a substrate used for support; (b) a multilayer film which is supported on the substrate, and which reflects exposure light comprising at least one of extreme ultraviolet radiation and soft X-radiation from source light in a prescribed wavelength region; (c) and a protective layer which is provided on the multilayer film, which has a surface-side layer on its outermost.

As with the aforementioned optical element, this optical element also has oxidation-resistant properties due to the fact that, in a state of saturated oxidation; oxidation does not occur beyond that point. Moreover, it also has absorptivity to non-exposure light, because absorption of non-exposure light occurs more in a state of unsaturated oxidation than in a state of saturated oxidation. In short, it is possible to inhibit oxidation of the optical element, and prevent a reduction in the reflectance of the optical element by means of an oxidation-resistant portion of the protective layer that is saturated by oxidation. In addition, it is possible to relatively absorb non-exposure light compared to exposure light, and reduce the non-exposure light that is projected onto a sensitive substrate such as a wafer by means of a non-exposure-light-absorptive portion of the protective layer that is unsaturated by oxidation.

Still another aspect of the present invention provides an exposure apparatus including: (a) a light source which generates extreme ultraviolet radiation; (b) an illumination optical system which guides the extreme ultraviolet radiation from the light source to a mask used for transference; (c) and a projection optical system which forms a pattern image of the mask on a sensitive substrate. In this exposure apparatus, at least any one of the mask, the illumination optical system, and the projection optical system contains the aforementioned optical element.

By using at least one of the aforementioned optical elements in the aforementioned exposure apparatus, it is possible to inhibit oxidation of the surface of the pertinent optical element inside the apparatus, thereby enabling maintenance of the reflective properties of the optical element over a long period. This means that the throughput of the exposure apparatus can be maintained over a long period, and that the exposure apparatus can be given a long life. By using the aforementioned optical elements, it is also possible to reduce non-exposure light, from the light source, that is unnecessary for exposure, and to suppress the non-exposure light that is received by the sensitive substrate or the like, thereby enabling achievement of a high-precision exposure apparatus.

Still another aspect of the present invention provides a device manufacturing method. In the method, it is possible to manufacture high-performance devices by using the aforementioned exposure apparatus in a manufacturing process.

DESCRIPTION OF THE EMBODIMENTS

First Embodiment

Figure 1:
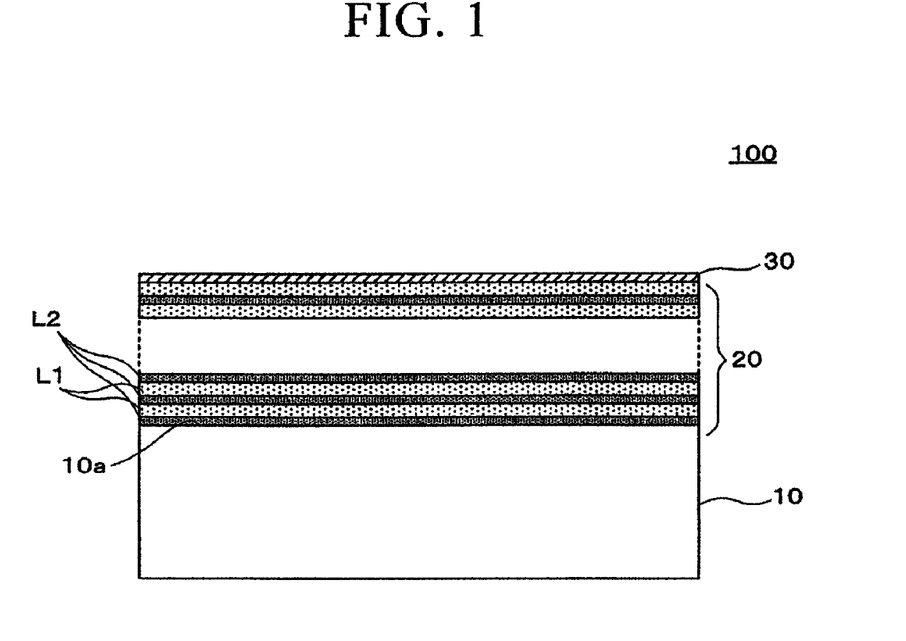
FIG. 1 is a cross-sectional view that serves to describe the optical element pertaining to a first embodiment.

FIG. 1 is a cross-sectional view which shows the structure of the optical element pertaining to a first embodiment. The optical element 100 of the present embodiment is, for example, a flat mirror and has a substrate 10 that supports a multilayer film structure, a multilayer film 20 for reflection, and a protective layer 30 that constitutes the surface layer.

The underlying substrate 10 is formed, for example, by machining synthetic quartz glass or low-expansion glass, and its top face 10a is polished to a mirror surface of prescribed accuracy. The top face 10a may be made into a plane as illustrated in the drawing, or it may be made concave, convex, multifaceted or some other shape (not illustrated in the drawing) according to the application of the optical element 100.

The multilayer film 20 that is above is a thin film of from several layers to several hundred layers, and is formed by alternately laminating two types of materials having different refractive indices. In order to raise the reflectance of the optical element 100 which is a mirror, this multilayer film 20 is provided with numerous lamination layers of low-absorption material, and the film thickness of each layer is adjusted based on optical interferometry so that the phases of the respective reflected waves are balanced. In short, the multilayer film 20 is formed by alternately laminating in prescribed film thicknesses a thin-film layer L1, which has a comparatively small refractive index relative to the wavelength region of the extreme ultraviolet radiation that is used in the exposure apparatus, and a thin-film layer L2, which has a comparatively high refractive index relative thereto, so that the phases of the reflected waves are balanced. By this means, it is possible to efficiently raise the reflectance of extreme ultraviolet radiation and the like in the target wavelength. In order to simplify the description, the actual number of lamination layers of the multilayer film 20 is illustrated in the drawing with omissions (dashed lines).

The two types of thin-film layers L1 and L2 which configure this multilayer film 20 can be composed respectively of a silicon (Si) layer and a molybdenum (Mo) layer. Conditions such as the lamination sequence of the thin-film layers L1 and L2 and which of the thin-film layers is to constitute the outermost layer can be suitably varied according to the application of the optical element 100. The materials of the thin-film layers L1 and L2 are not limited to a combination of Si and Mo. For example, the multilayer film 20 may be fabricated by suitably combining materials such as Si, beryllium (Be), and carbon tetraboride ($B_4C$) with materials such as Mo, ruthenium (Ru), and rhodium (Rh).

In the multilayer film 20, it is also possible to provide a further boundary layer (not illustrated in the drawing) between the thin-film layer L1 and the thin-film layer L2. Particularly in the case where metal or Si or the like is used as the thin-film layers L1 and L2 that form the multilayer film 20, there is a tendency for the mated materials that respectively form the thin-film layer L1 and thin-film layer L2 to intermingle at their boundary area, and for the interface to be ill-defined. In consequence, reflective properties may be affected, and the reflectance of the optical element 100 may decline. Thus, in order to render the interface more distinct, a further boundary layer is provided between the thin-film layer L1 and thin-film layer L2 when forming the multilayer film 20. As the material of this boundary layer, one may use, for example, $B_4C$, carbon (C), molybdenum carbide (MoC), molybdenum oxide ($MoO_2$), etc. By rendering the interface more distinct in this manner, the reflective properties of the optical element 100 are enhanced.

Figure 2:
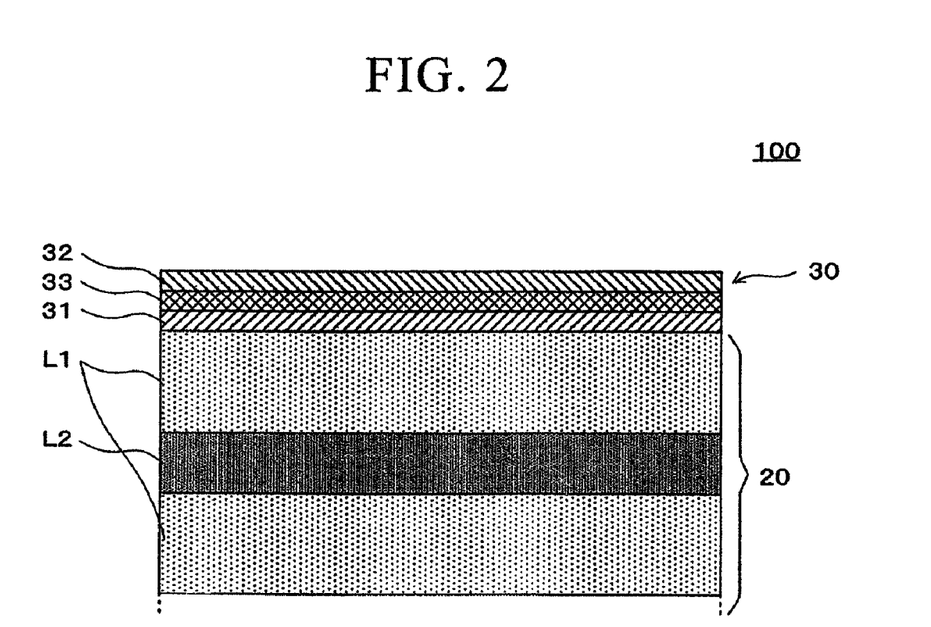
FIG. 2 is a cross-sectional view that serves to describe in detail the upper layers of the multilayer film and the vicinity of the protective layer in the optical element of FIG. 1.

FIG. 2 is a cross-sectional view that serves to describe the top layer of the multilayer film 20 and the protective layer 30. The protective layer 30 protects the multilayer film 20 from the ambient environment (generally, a reduced-pressure or vacuum environment that provides efficient transmission of extreme ultraviolet radiation) by covering the entire surface of the multilayer film 20. Moreover, in relative terms, the protective layer 30 absorbs more of the non-exposure light than of the exposure light of the incoming source light.

The protective layer 30 is formed so that its composition changes in the depthwise direction, and has an interfacial-side layer 31 which is provided on top of the thin-film layer L1 that is the outermost layer of the multilayer film 20, a surface-side layer 32 which is provided above the interfacial-side layer 31 and which constitutes the outermost surface of the optical element 100, and an intermediate layer 33 which is provided between the two layers 31 and 32. For purposes of convenience of description, the protective layer 30 is divided into the three layers 31, 32, and 33, but these layers 31, 32, and 33 are integrally formed by a continuous change of composition, and no clear boundaries exist among them.

The protective layer 30 is formed in its entirety by increasing the partial pressure of oxygen during sputtering. The respective thicknesses of the interfacial-side layer 31, surface-side layer 32, and intermediate layer 33 can be controlled by adjusting the timing in which the partial pressure of oxygen is varied during sputtering. These thicknesses are appropriately adjusted in consideration of the reflective properties of the optical element 100.

In the protective layer 30, the interfacial-side layer 31 is formed of a compound which is in a state of unsaturated oxidation. Specifically, silicon monoxide (SiO) may be used as the material of the interfacial-side layer 31, and titanium monoxide (TiO), zirconium monoxide (ZrO), etc., may also be used as other materials that have similar properties. The interfacial-side layer 31 has the property of relatively absorbing non-exposure light from the source light. In the case where Si is used as the target material for forming the interfacial-side layer 31, X of SiOx of the interfacial-side layer can be within 0 to 2. The same also applies to the case of Ti and the case of Zr.

The surface-side layer 32 is formed of a compound which is in a state of saturated oxidation. Specifically, silicon dioxide ($SiO_2$) may be used as the material of the surface-side layer 32, and titanium dioxide ($TiO_2$), zirconium dioxide ($ZrO_2$), etc., may also be used as other materials that have similar properties. As the surface-side layer 32 does not oxidize beyond the oxidation state of its constituent material, its structure is stable. The surface-side layer 32 has oxidation resistance which is superior to that of the interfacial-side layer 31 that is unsaturated by oxidation. That is, the layer 32 has stable oxidation resistance.

Figure 3:
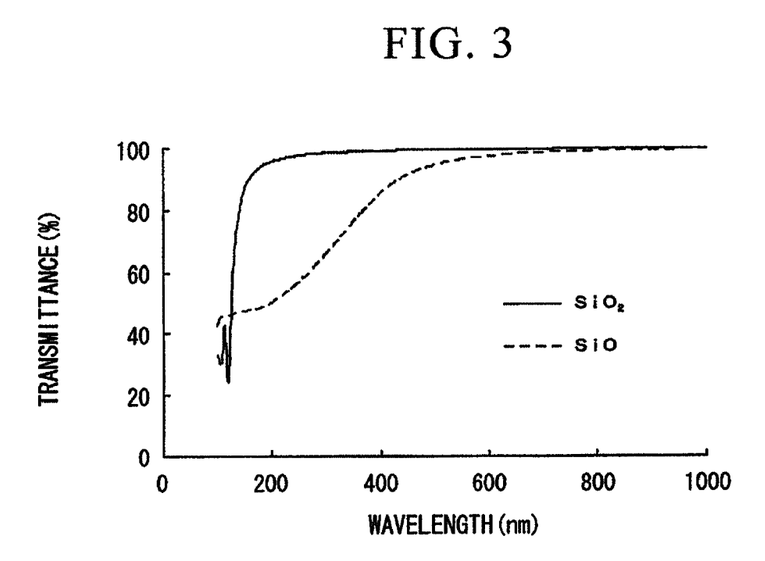
FIG. 3 is a graph that shows the relation of the transmittances of SiO and $SiO_2$ relative to prescribed wavelengths contained in the source light.

FIG. 3 was drawn in order to describe the role of the interfacial-side layer 31 and the surface-side layer 32 of FIG. 2, and is a graph that shows the relation of the transmittance of Si and $SiO_2$ of 10 nm thickness relative to prescribed wavelengths included in the source light. The non-exposure light other than exposure light in the source light includes at least any one of ultraviolet radiation, visible light, and infrared light, and it is the ultraviolet radiation region of approximately 150-400 nm in wavelength in particular that adversely affects the exposure light, that is, the light to which the resist is sensitive. From the drawing, it is clear that the transmittance of $SiO_2$ in the ultraviolet radiation region of 150-400 nm wavelength is high, and that the transmittance of SiO is low. In short, $SiO_2$ which is saturated by oxidation is transparent with respect to ultraviolet radiation of this region, and has the property of transmitting non-exposure light. On the other hand, SiO which is unsaturated by oxidation has the property of absorbing non-exposure light from the source light. The foregoing is a description concerning silicon oxide material, but the same properties are obtained in the cases of titanium oxide and zirconium oxide.

Returning to FIG. 2, the intermediate layer 33 is in a transitional state between a state that is saturated by oxidation and a state that is unsaturated by oxidation, and has both properties of the interfacial-side layer 31 and the surface-side layer 32. For example, in the case of a protective layer 30 that contains SiO and $SiO_2$, the composition of the intermediate layer 33 is $SiO_x$ (X=1 to 2), which is a state where the composition continuously changes from the X=1 of SiO to the X=2 of $SiO_2$. The same also applies to the cases of titanium oxide and zirconium oxide, where the composition of the intermediate layer 33 is respectively $TiO_x$ (X=1 to 2) and $ZrO_x$ (X=1 to 2), which is a state where the composition continuously changes from X=1 to X=2.

The transitional state is not limited to a state in which the composition evenly and gradually changes. Alternatively, for example, SiOx can unevenly change in X=0 to 2 for forming the intermediate layer. The same also applies to the case of Ti and the case of Zr.

In the case where organic matter remains inside the exposure apparatus, carbon is deposited on the surface of the optical element 100, and a phenomenon occurs where the reflective properties of the optical element 100 are degraded. The carbon that is deposited on the surface of the optical element 100 is removed when oxidation occurs. Consequently, in order to inhibit the deposition of carbon while protecting the multilayer film 20 of the optical element 100, it is sufficient if the surface of the optical element 100 has oxidation resistance. According to the present embodiment, the surface-side layer 32 is not only able to prevent oxidation of the surface of the multilayer film 20, but it is also able to prevent carbon deposition on the surface of the multilayer film 20 by oxidizing the carbon that is deposited on the surface thereof in the case where use is conducted in an oxidizing atmosphere. As a result of the aforementioned oxidation prevention and carbon deposition prevention, it is possible to inhibit lowering of the reflectance of the multilayer film 20 over a long period.

In addition, according to the present embodiment, the interfacial-side layer 31 plays the role of inhibiting projection of non-exposure light from the projection optical system to the wafer, and enables inhibition of sensitization of the wafer by non-exposure light. As a method of reducing the non-exposure light, one may also conceive of a method wherein a non-exposure light separation filter is inserted into the optical system, but such non-exposure light separation filters have the drawbacks that they are very breakable, that providing them with a large diameter is difficult, that transmittance of exposure light is approximately 50% lower, etc. On the other hand, the optical element 100 of the present embodiment eliminates the necessity of independently providing a non-exposure light separation filter, and absorbs non-exposure light while efficiently reflecting exposure light, thereby enabling mitigation of the loss of the reflected light volume of the exposure light.

FIRST EXAMPLE

Below, a description is given of a specific working example of the optical element 100 pertaining to the first embodiment. "ULE"® (Ultra-Low Expansion), which is a low thermal expansion glass manufactured by Corning International Co., was used as the material of the substrate 10. One may also use other low thermal expansion glass instead of ULE, such as "Zerodur" ® manufactured by Schott Co., and "CLEARCERAM-Z"® manufactured by Ohara Co. In order to prevent a reduction in reflectance due to surface roughness of the substrate 10, the surface of the substrate 10 is polished to a surface roughness of 0.3 nm RMS or less.

A multilayer film 20 of Mo/Si type was then formed by the sputtering method on the aforementioned substrate 10. In this case, the thin-film layer L1 was a Si layer with a small difference relative to a refractive index of 1, and its thickness was set to 4.6 nm. The thin-film layer L2 was a Mo layer with a large difference relative to a refractive index of 1, and its thickness was set to 2.3 nm. Accordingly, the thickness of one cycle (cycle length) of the multilayer film 20 was 4.6+2.3=6.9 nm. Formation of the multilayer film 20 was started from the thin-film layer L2 of Mo, on which a thin-film layer L1 of Si and a thin-film layer L2 of Mo were alternately laminated. A total of 45 layers of the thin-film layer L1 of Si and a total of 45 layers of the thin-film layer L2 of Mo were laminated to complete the multilayer film 20.

The protective layer 30 was then formed by the sputtering method on top of the uppermost layer of the multilayer film 20, that is, on the 45th layer of the thin-film layer L1 of Si. The thickness of the thin film serving as the protective layer 30 was set to the same 2.3 nm as the thin-film layer L2 of Mo. As the thickness of the protective layer 30 of this case was determined with a view to contributing to reflection in the 13.5 nm wavelength of extreme ultraviolet radiation, the thickness changes according to the substance of the layer. Moreover, Mo tends to absorb extreme ultraviolet radiation, while Si, in contrast, tends to transmit it. Consequently, in order to improve the reflective properties pertaining to extreme ultraviolet radiation, it is desirable that the sequence of lamination on top of the multilayer film 20 alternate from the material that is absorptive to the material that is transmissive relative to extreme ultraviolet radiation. Here, the interfacial-side layer 31 of the protective layer 30 is absorptive relative to extreme ultraviolet radiation, while the surface-side layer 32 is transmissive. Accordingly, as the configuration of the protective layer is such that the surface-side layer 32 is provided on top of the interfacial-side layer 31, the protective layer 30 is formed on top of the thin-film layer L1 of Si.

In the present embodiment, in the case where the interfacial-side layer 31 is SiO and the surface-side layer 32 is $SiO_2$, the protective layer 30 containing SiO and $SiO_2$ is formed by a reactive sputtering method that intermingles oxygen with an inert gas such as argon and that uses Si as the target material. By changing the partial pressure of oxygen during film formation, it is possible to change the composition of the protective layer 30 in the depthwise direction from SiO to $SiO_2$. Specifically, in this example, the partial pressure of oxygen is changed from $1 \times 10^{-2}$ to $5 \times 10^{-2}$ Pa.

As described above, the multilayer film 20 of Mo/Si type and the protective layer 30 are continuously formed inside the same film-formation apparatus without breaking the vacuum. During film formation, the substrate 10 is water-cooled, and maintained at room temperature.

In the present embodiment, an example was described where the interfacial-side layer 31 is SiO, and the surface-side layer 32 is $SiO_2$. Alternatively, as mentioned above, it is also acceptable if the interfacial-side layer 31 is TiO, and the surface-side layer 32 is $TiO_2$. In this case, film formation is conducted while continuously adjusting the partial pressure of oxygen in the same manner described above, using Ti as the target material. Moreover, it is also acceptable if the interfacial-side layer 31 is ZrO and the surface-side layer 32 is $ZrO_2$. In this case, film formation is conducted while continuously adjusting the partial pressure of oxygen in the same manner described above, using Zr as the target material.

SECOND EXAMPLE

Below, a description is given of a specific second example of the optical element 100 pertaining to the first embodiment. It should be noted that the optical element 100 in the second example is a modified example of the first example. Substantial descriptions of elements that are identical to the elements of the first example are omitted.

In the second example, the protective layer 30 is provided on top of the Si layer (i.e., the topmost Si thin film layer L1) that is the topmost layer of the Mo/Si multilayer film 20 and that has a thickness of 3.2 nm. In the protective layer 30, the interfacial-side layer 31 consisting of SiO and having a thickness of 3.2 nm is formed, the intermediate layer 33 consisting of $SiO_{1.5}$ and having a thickness of 3.2 nm is formed, and the surface-side layer 32 consisting of $SiO_2$ and having a thickness of 3.2 nm is formed.

Figure 4A:
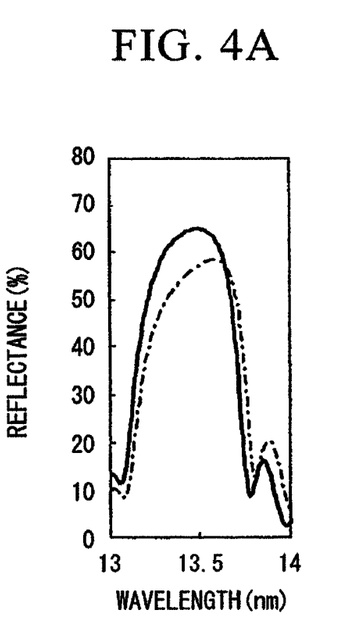
FIGS. 4A and 4B show reflection characteristics of the optical element in a second example.
Figure 4B:
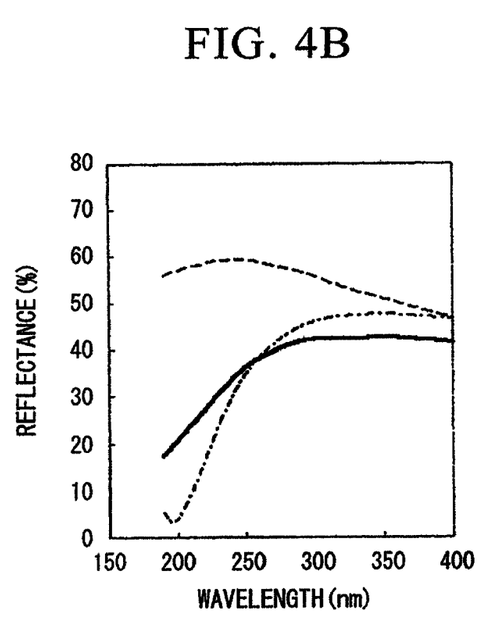

FIGS. 4A and 4B show reflection characteristics of the optical element 100 in the second example. In FIG. 4A, the solid line represents a reflectance for the light in a vicinity of a region from a wavelength of 13 nm to a wavelength of 14 nm. In FIG. 4B, the solid line represents a reflectance for the light in a vicinity of a region from a wavelength of 190 nm to a wavelength of 400 nm. In FIGS. 4A and 4B, as a comparative example, the alternate long and short dash line shows the reflection characteristic of an optical element in which the protective layer 30 is provided on the Mo/Si multilayer film 20, specifically, $Si_3N_4$ with non-exposure light absorptivity and a thickness of 10 nm is provided on the Mo/Si multilayer film 20, and Ru with oxidation-resistant properties and a thickness of 1.5 nm is provided thereon. Furthermore, in FIG. 4B, the dashed line shows the reflection characteristic of an optical element in which no protective layer 30 is provided on the Mo/Si multilayer film 20.

As is shown from FIGS. 4A and 4B, in the present example, by using SiO, $SiO_{1.5}$, and $SiO_2$ as the protective layer 30, the optical element 100 can have a characteristic that it absorbs non-exposure light while efficiently reflecting exposure light.

THIRD EXAMPLE

Below, a description is given of a specific third example of the optical element 100 pertaining to the first embodiment. It should be noted that the optical element 100 in the third example is a modified example of the first example. Substantial descriptions of elements that are identical to the elements of the first example are omitted.

In the third example, the protective layer 30 is provided on top of the Si layer (i.e., the topmost Si thin film layer L1) that is the topmost layer of the Mo/Si multilayer film 20 and that has a thickness of 1.3 nm. In the protective layer 30, the interfacial-side layer 31 consisting of SiO and having a thickness of 1.3 nm is formed, the intermediate layers 33 consisting of $SiO_{1.5}$, $SiO_2$, $SiO_{1.5}$, SiO, Si, SiO, and $SiO_{1.5}$, respectively, in series and each having a thickness of 1.3 nm are formed, and the surface-side layer 32 consisting of $SiO_2$ and having a thickness of 1.3 nm is formed.

Figure 5A:
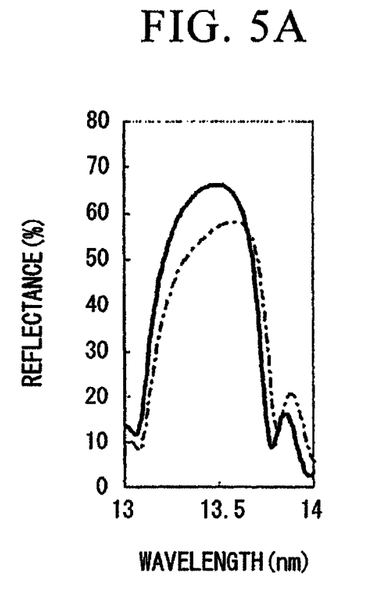
FIGS. 5A and 5B show reflection characteristics of the optical element in a third example.
Figure 5B:
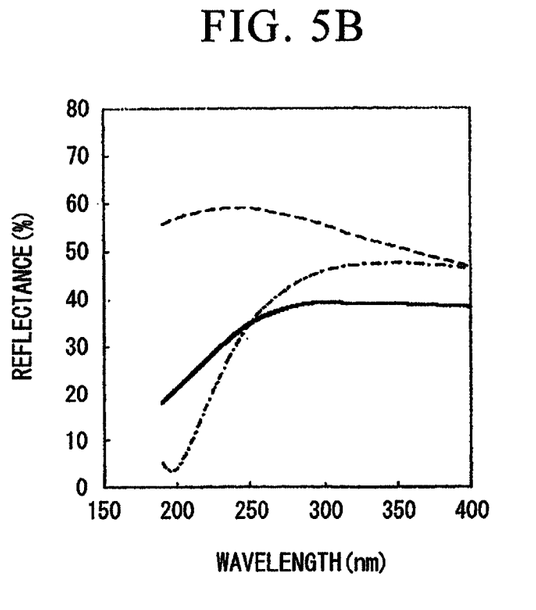

FIGS. 5A and 5B show reflection characteristics of the optical element 100 in the third example. The solid line, the alternate long and short line, and the dashed line show the same representations as that of the second example.

As is shown from FIGS. 5A and 5B, in the present example, by using Si, SiO, $SiO_{1.5}$, and $SiO_2$ as the protective layer 30, the optical element 100 can have a characteristic that it absorbs non-exposure light while efficiently reflecting exposure light.

FOURTH EXAMPLE

Below, a description is given of a specific fourth example of the optical element 100 pertaining to the first embodiment. It should be noted that the optical element 100 in the fourth example is a modified example of the first example. Substantial descriptions of elements that are identical to the elements of the first example are omitted.

In the fourth example, the protective layer 30 is provided on top of the Si layer (i.e., the topmost Si thin film layer L1) that is the topmost layer of the Mo/Si multilayer film 20 and that has a thickness of 2.9 nm. In the protective layer 30, the interfacial-side layer 31 consisting of SiO and having a thickness of 15.1 nm is formed, and the surface-side layer 32 consisting of $SiO_2$ and having a thickness of 1.5 nm is formed.

Figure 6A:
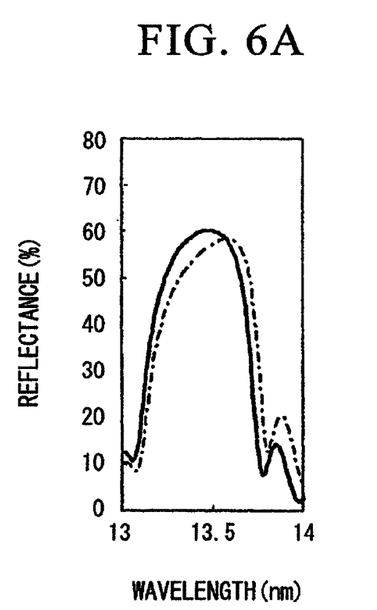
FIGS. 6A and 6B show reflection characteristics of the optical element in a fourth example.
Figure 6B:
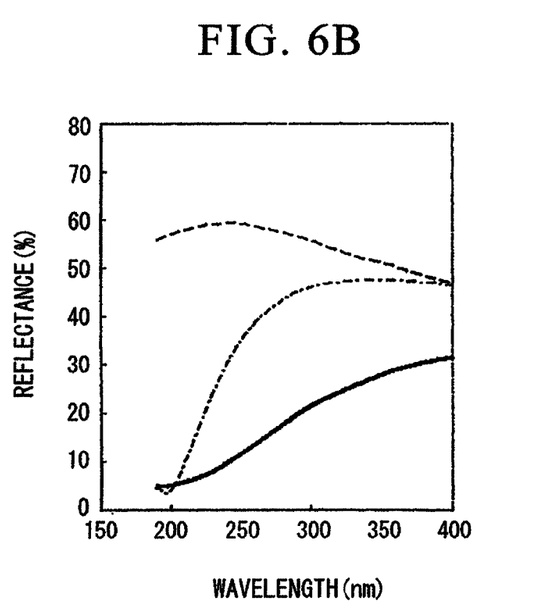

FIGS. 6A and 6B show reflection characteristics of the optical element 100 in the fourth example. The solid line, the alternate long and short line, and the dashed line show the same representations as that of the second example.

As is shown from FIGS. 6A and 6B, in the present example, by using SiO and $SiO_2$ as the protective layer 30, the optical element 100 can have a characteristic that it absorbs non-exposure light while efficiently reflecting exposure light.

Second Embodiment

The present embodiment is a variation of the manufacturing method of the optical element 100 of the above-described first embodiment; identical components are assigned identical reference symbols, and description thereof is omitted. In addition, parts which are given no particular description are the same as those of the first embodiment.

The optical element of the second embodiment has a structure which is almost identical to that of the optical element 100 shown in FIG. 1. However, while the description of the first embodiment concerned the case where the sputtering method was used with variation of the partial pressure of oxygen as the film formation method of the protective layer 30, in the second embodiment, the protective layer 30 is formed by a method that oxidizes the surface into $SiO_2$ after SiO film formation without variation of the partial pressure of oxygen. Specifically, in the case where the interfacial-side layer 31 is SiO and the surface-side layer 32 is $SiO_2$, the multilayer film 20 is formed on top of the substrate 10, and film formation of a SiO layer of, for example, 2.3 nm is conducted on top of this multilayer film 20 using SiO as the target material. Subsequently, the substrate is placed in the atmosphere, whereby the surface-side layer of the SiO layer is oxidized, and $SiO_2$ is formed. By this means, it is possible to form a protective layer 30 having SiO in the interfacial-side layer 31 and $SiO_2$ in the surface-side layer 32. In the cases where the interfacial-side layer 31 is TiO and the surface-side layer 32 is $TiO_2$, and where the interfacial side layer 31 is ZrO and the surface-side layer 32 is $ZrO_2$, the protective layer 30 may be formed by the same method by respectively using TiO and ZrO as the target material.

Third Embodiment

Figure 7:
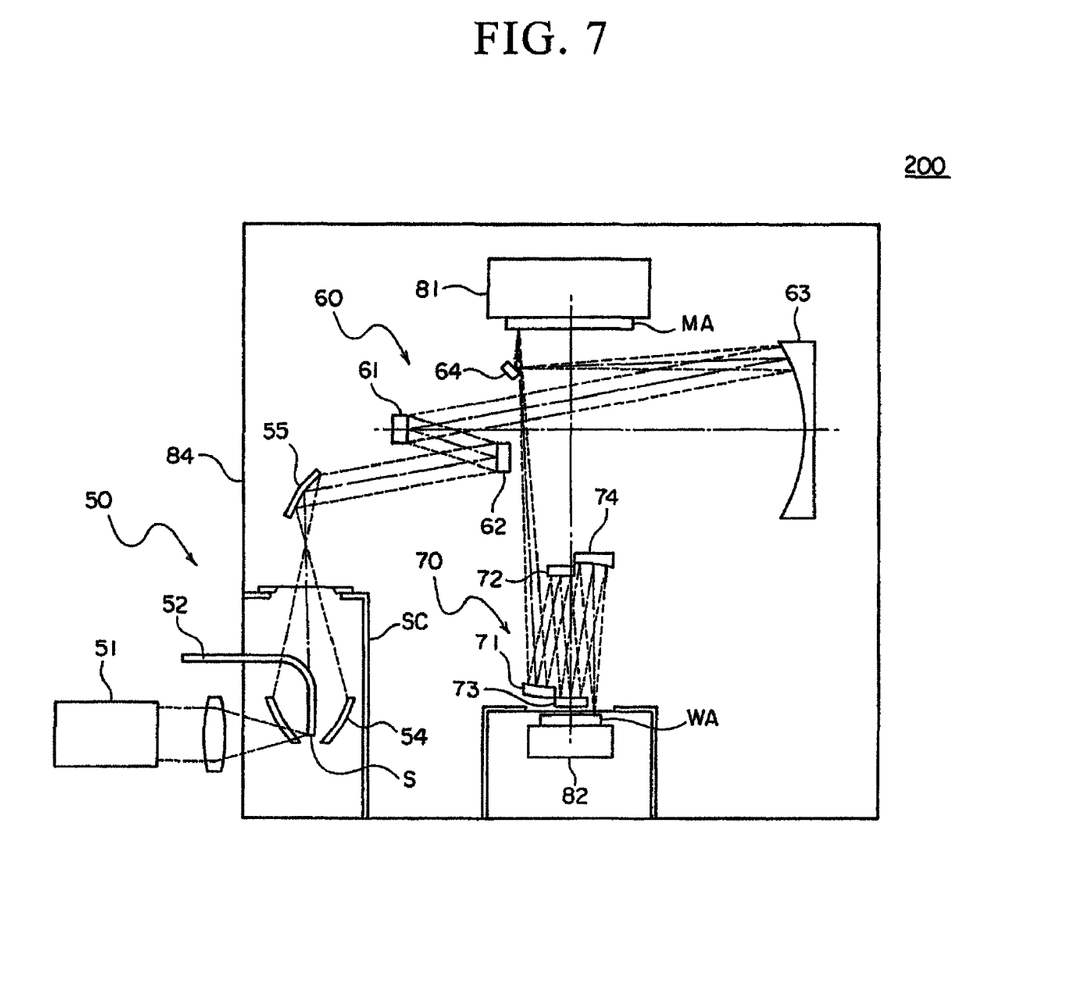
FIG. 7 is a cross-sectional view that serves to describe the exposure apparatus pertaining to a third embodiment.

FIG. 7 is a drawing that serves to describe the structure of an exposure apparatus 200 pertaining to a third embodiment, which incorporates the optical element 100 of the first and second embodiments as an optical part.

As shown in FIG. 7, as its optical system, this exposure apparatus 200 is provided with a light source apparatus 50 that generates extreme ultraviolet radiation, an illumination optical system 60 that illuminates a mask MA by illuminating light of extreme ultraviolet radiation, and a projection optical system 70 that transfers a pattern image of the mask MA onto a wafer WA, and as its mechanical mechanism, it is provided with a mask stage 81 that supports the mask MA, and a wafer stage 82 that supports the wafer WA. Here, the wafer WA embodies a sensitive substrate, and the photosensitive layer of a resist or the like is surface coated.

The light source apparatus 50 is provided with a laser light source 51 which generates laser light used for plasma excitation, and a tube 52 which supplies a gas such as xenon that is the target material into a casing SC. In addition, a capacitor 54 and a collimator mirror 55 are attached as accessories to this light source apparatus 50. By focusing the laser light from the laser light source 51 on the xenon emitted from the tip of the tube 52, the target material of this portion is turned into plasma, and generates extreme ultraviolet radiation. The capacitor 54 collects the extreme ultraviolet radiation that is generated at the tip S of the tube 52. The extreme ultraviolet radiation that transits the capacitor 54 is emitted to the exterior of the casing SC while converging, and is received by the collimator mirror 55. Instead of source light from the foregoing laser plasma type of light source apparatus 50, one may also use emitted light or the like from a discharge plasma radiation source or a synchrotron radiation source.

The illumination optical system 60 is configured from reflective optical integrators 61 and 62, a condenser mirror 63, a bent mirror 64, etc. The source light from the light source apparatus 50 is homogenized as illuminating light by the optical integrators 61 and 62, is focused by the condenser mirror 63, and is received in the prescribed wavelength region (e.g., a band region) onto the mask MA via the bent mirror 64. By this means, it is possible to uniformly illuminate a prescribed region on the mask MA by extreme ultraviolet radiation of appropriate wavelength.

There does not exist a substance that has adequate transmittance in the wavelength region of extreme ultraviolet radiation, and a reflective mask is used for the mask MA, rather than a transmissive mask.

The projection optical system 70 is a reduced projection system configured by numerous mirrors 71, 72, 73, and 74. A circuit pattern, which is the pattern image formed on the mask MA, is imaged by the projection optical system 70 onto the wafer WA to which a resist is applied, and is transferred to this resist. In this case, the region onto which the circuit pattern is instantly projected is a rectilinear or arc-shaped slit region, and it is possible to efficiently transfer, for example, the circuit pattern of a rectangular region that is formed on top of the mask MA to a rectangular region on top of the wafer WA by scanning exposure that synchronously moves the mask MA and the wafer WA.

The portions in the aforementioned light source apparatus 50 that are disposed on the optical path of extreme ultraviolet radiation, the illumination optical system 60, and the projection optical system 70 are disposed within a vacuum container 84 to prevent attenuation of the exposure light. In short, extreme ultraviolet radiation is absorbed and attenuated in the atmosphere, but an attenuation of extreme ultraviolet radiation, that is, a reduction in luminance and a reduction in contrast of the transfer image are prevented by shielding the entire apparatus from the exterior by the vacuum container 84, and by maintaining the optical path of extreme ultraviolet radiation at a prescribed degree of vacuum (for example, $1.3 \times 10^{-3}$ Pa or less).

In the foregoing exposure apparatus 200, the optical element 100 illustrated in FIG. 1 is used as the optical element 54, 55, 61, 62, 63, 64, 71, 72, 73, 74, and the mask MA that are disposed on the optical path of extreme ultraviolet radiation. In this case, the shape of the optical surface of the optical element 100 is not limited to a plane, and may be suitably adjusted by sites that incorporate concavities, convexities, multiple facets, etc.

With respect to the exposure apparatus 200, in order to remove the carbon that is deposited on the surface of the optical element 100, it is possible to create the conditions of an oxidizing atmosphere by conducting gas control inside the exposure apparatus 200. These oxidizing atmosphere conditions are adjusted by appropriately conducting introduction and discharge of oxidative gas based on the illuminance of the exposure light.

Below, a description is given concerning the operation of the exposure apparatus 200 that is shown in FIG. 7. In this exposure apparatus 200, the mask MA is irradiated by illuminating light from the illumination optical system 60, and the pattern image on the mask MA is projected onto the wafer WA by the projection optical system 70. By this means, the pattern image of the mask MA is transferred to the wafer WA.

In the above-described exposure apparatus 200, an optical element 54, 55, 61, 62, 63, 64, 71, 72, 73, 74 and a mask MA are used that are controlled with a high degree of accuracy at high reflectance; there is high resolution, and highly accurate exposure is possible. Furthermore, the optical properties of the optical element 54, 55, 61, 62, 63, 64, 71, 72, 73, 74, and the mask MA can be maintained over a long period by inhibiting the oxidation and carbon deposition of the optical element. As a result, the resolution of the exposure apparatus 200 can be maintained, and, by extension, the life of the exposure apparatus 200 can be prolonged. Moreover, the exposure apparatus can be made highly accurate by decreasing non-exposure light from the source light by inhibiting the reflection of non-exposure light by the optical element.

Fourth Embodiment

Figure 8:
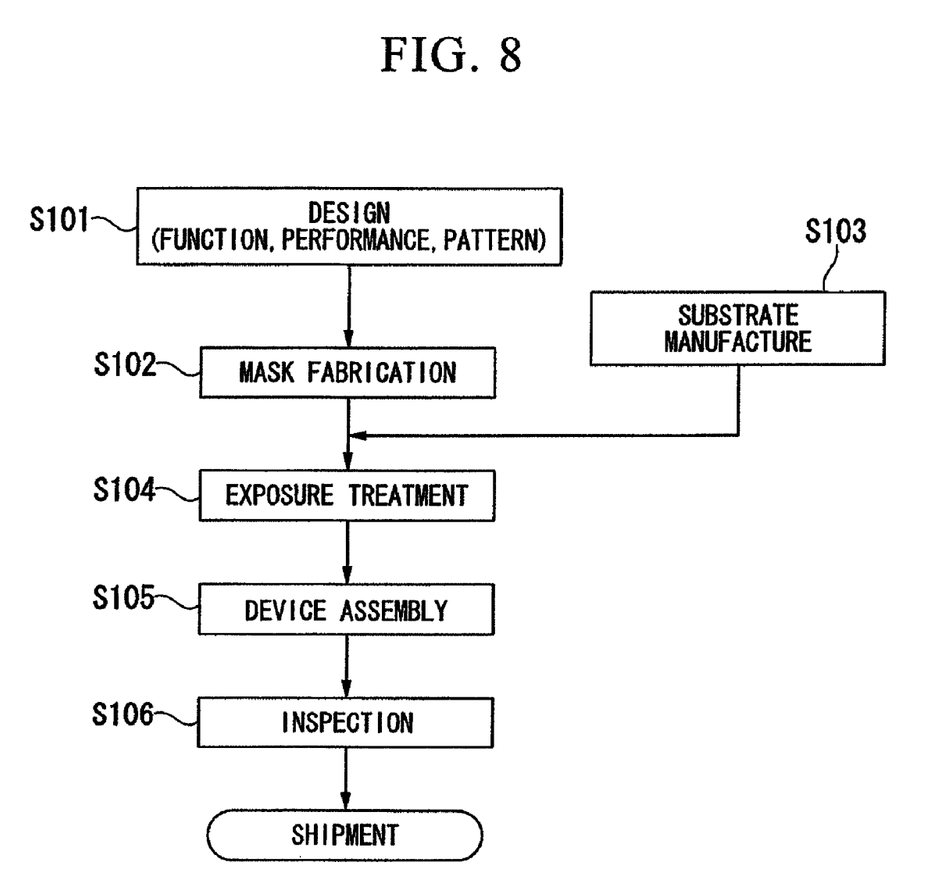
FIG. 8 is a drawing that serves to describe the device manufacturing method pertaining to a fourth embodiment.

The foregoing was a description of the exposure apparatus 200 and an exposure method using this, and it is possible to offer a device manufacturing method for manufacturing semiconductor devices and other micro-devices with a high degree of integration by using this exposure apparatus 200. When a specific description is given, as shown FIG. 8, the micro-device is manufactured via a process (S101) wherein design and the like of the functions and performance of the micro-device are conducted, a process (S102) wherein the mask MA is fabricated based on this design process, a process (S103) wherein the substrate—i.e., the wafer WA—which is the base material of the device is prepared, an exposure treatment process (S104) wherein the pattern of the mask MA is exposed on the wafer WA by the exposure apparatus 200 of the above-described embodiment, a device assembly process (S105) wherein the element is completed while repeating a series of exposures or etchings, etc., and a device inspection process (S106) following assembly. It should be noted that the device assembly process (S105) ordinarily includes a dicing process, a bonding process, a packaging process, etc.

The foregoing was a description of the present invention in conformity with embodiments, but the present invention is not limited to the aforementioned embodiments. For example, with respect to the film formation method of the protective layer 30, a film formation method other than the sputtering method may be used so long as it does not worsen surface roughness, and enables formation of fine film. Moreover, another material may be formed as a film between the multilayer film 20 and protective layer 30 in order to aid in curbing surface roughness and forming fine film, and in order to define the interface of the multilayer film 20 and protective film 30.

As the protective layer 30 that is provided on top of the multilayer film 20, it is also possible to create a two-layer structure by providing an oxidation-resistant protective layer which is formed on top of the non-exposure-light absorbing layer with material that is different from that of the non-exposure-light absorbing layer. However, as the material that is used as the oxidation-resistant protective layer generally has the property of reflecting non-exposure light, it is not easy to efficiently decrease the non-exposure light from the source light. Here, the aforementioned problem is resolved if one uses oxides of different material in the two layers (for example, a combination of SiO in the interfacial-side layer 31 and $TiO_2$ in the surface-side layer 32). However, the film formation process will be complicated compared to the case where the same oxide material is used.

In the foregoing embodiment, a description was given of an exposure apparatus 200 which uses extreme ultraviolet radiation as the exposure light, but even with an exposure apparatus which uses soft X-radiation or the like instead of extreme ultraviolet radiation as the source light, it is possible to incorporate an optical element identical to the optical element 100 that is illustrated in FIG. 1.

One may similarly incorporate the optical element 100 that is illustrated in FIG. 1 in a variety of optical equipment other than exposure apparatuses, including soft X-ray optical equipment such as soft X-ray microscopes and soft X-ray analyzers. The optical element 100 that is incorporated so as to be compatible with such soft X-ray optical equipment also inhibits the degradation of optical properties over long periods as in the case of the aforementioned embodiments, and mitigates unnecessary non-exposure light from the exposure light (in this case, simple illuminating light is also included in the exposure light) which is the light that is utilized from the source light.

What is claimed is:

1. An optical element, comprising:
    a substrate;
    a multilayer film supported on the substrate, the multilayer film reflecting exposure light, the exposure light comprising at least one of extreme ultraviolet radiation and soft X-radiation from source light in a prescribed wavelength region; and
    a protective layer provided on the multilayer film, the protective layer having a composition preventing oxidation of the multilayer film, the protective layer having an absorption index relative to non-exposure light, other than the exposure light, that is larger than the absorption index of the protective layer relative to the exposure light.

2. The optical element according to claim 1, wherein the non-exposure light comprises at least one of ultraviolet radiation, visible light, and infrared light.

3. The optical element according to claim 1, wherein a material composition of the protective layer changes along a depthwise direction.

4. The optical element according to claim 1, wherein the protective layer has a surface-side layer on its outermost surface side, the surface-side layer being in a state where it is saturated by oxidation, the protective layer also having an interfacial-side layer on its boundary face side adjoining the multilayer film, the boundary face side being in a state where it is unsaturated by oxidation.

5. The optical element according to claim 4, wherein the protective layer has a composition that prevents oxidation of the multilayer film by the surface-side layer.

6. The optical element according to claim 4, wherein the protective layer exhibits relative absorption of the non-exposure light from the source light by the interfacial-side layer.

7. The optical element according to claim 4, wherein the surface-side layer is formed with $SiO_2$, and the interfacial-side layer is formed with SiO.

8. The optical element according to claim 4, wherein the surface-side layer is formed with $TiO_2$, and the interfacial-side layer is formed with TiO.

9. The optical element according to claim 4, wherein the surface-side layer is formed with $ZrO_2$, and the interfacial-side layer is formed with ZrO.

10. The optical element according to claim 4, wherein the protective layer comprises an intermediate layer between the surface-side layer and the interfacial-side layer.

11. The optical element according to claim 10, wherein the intermediate layer comprises at least one of Si, SiO, $SiO_{1.5}$, and $SiO_2$.

12. The optical element according to claim 1, wherein the multilayer film is formed by alternately laminating on top of the substrate a first layer that is composed of material with a small refractive index difference relative to the refractive index of a vacuum in the extreme ultraviolet ray region, and a second layer that is composed of material with a large refractive index difference.

13. The optical element according to claim 1, wherein the protective layer is situated on top of the first layer that is the topmost layer of the multilayer film.

14. An exposure apparatus, comprising:

a light source that generates extreme ultraviolet radiation;

an illumination optical system that guides the extreme ultraviolet radiation from the light source to a mask used for pattern transfer; and a projection optical system that forms a pattern image of the mask on a sensitive substrate, wherein at least one of the mask, the illumination optical system, and the projection optical system comprises the optical element according to claim 1.

15. A device manufacturing method comprising a pattern-exposure step performed using the exposure apparatus according to claim 14.

* * * * *